US012568819B2

(12) United States Patent
Sakurai et al.

(10) Patent No.: US 12,568,819 B2
(45) Date of Patent: Mar. 3, 2026

(54) SEMICONDUCTOR STRUCTURE

(71) Applicant: Powerchip Semiconductor Manufacturing Corporation, Hsinchu (TW)

(72) Inventors: Michio Sakurai, Hsinchu City (TW); Shou-Zen Chang, Hsinchu City (TW); I Hsuan Wei, Taoyuan City (TW); Wei-Lin Wang, Taichung City (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 377 days.

(21) Appl. No.: 18/334,380

(22) Filed: Jun. 14, 2023

(65) Prior Publication Data

US 2024/0321725 A1 Sep. 26, 2024

(30) Foreign Application Priority Data

Mar. 25, 2023 (TW) .................................. 112111402

(51) Int. Cl.
H01L 23/522 (2006.01)
H10D 1/68 (2025.01)
(52) U.S. Cl.
CPC ...... H01L 23/5223 (2013.01); H01L 23/5226 (2013.01); H10D 1/692 (2025.01)
(58) Field of Classification Search
CPC ............. H01L 23/5223; H01L 23/5226; H01L 23/642; H10D 1/692; H10D 1/696; H10N 97/00
See application file for complete search history.

(56) References Cited

U.S. PATENT DOCUMENTS

| | | | |
|---|---|---|---|
| 6,777,777 B1 | 8/2004 | Kar-Roy et al. | |
| 7,956,400 B2 | 6/2011 | Smith | |
| 2009/0200638 A1* | 8/2009 | Smith ...................... | H10D 1/68 |
| | | | 257/532 |
| 2015/0132905 A1 | 5/2015 | Liao et al. | |
| 2015/0187598 A1* | 7/2015 | Campbell ......... | H01L 21/32133 |
| | | | 438/396 |
| 2016/0005751 A1 | 1/2016 | Tsui et al. | |

FOREIGN PATENT DOCUMENTS

TW 201517236 5/2015

OTHER PUBLICATIONS

"Office Action of Taiwan Counterpart Application", issued on Apr. 25, 2024, p. 1-p. 5.

* cited by examiner

*Primary Examiner* — Patricia D Valenzuela
(74) *Attorney, Agent, or Firm* — JCIPRNET

(57) ABSTRACT

A semiconductor structure including a substrate and a capacitor structure is provided. The capacitor structure is disposed above the substrate. The capacitor structure includes a first electrode layer, a second electrode layer, and a first dielectric layer. The second electrode layer is disposed on the first electrode layer. The first dielectric layer is disposed between the first electrode layer and the second electrode layer. The first dielectric layer is a composite dielectric layer including at least one first silicon nitride layer and at least one first high-k dielectric layer.

20 Claims, 3 Drawing Sheets

SEMICONDUCTOR STRUCTURE

CROSS-REFERENCE TO RELATED APPLICATION

This application claims the priority benefit of Taiwanese application no. 112111402, filed on Mar. 25, 2023. The entirety of the above-mentioned patent application is hereby incorporated by reference herein and made a part of this specification.

BACKGROUND

Technical Field

The invention relates to a semiconductor structure, and particularly relates to a semiconductor structure including a capacitor structure.

Description of Related Art

The capacitor is a device widely used in the semiconductor structure. Currently, the capacitance value of the capacitor is usually increased by reducing the thickness of the dielectric layer between the two electrodes. However, since the thickness of the dielectric layer becomes thinner, the reliability of the capacitor is decreased. A common solution is to use a high dielectric constant (high-k) dielectric layer as the dielectric layer in the capacitor to increase the capacitance value of the capacitor. In addition, in order to improve the reliability of the capacitor, the high-k dielectric layer must have sufficient thickness. However, since the deposition rate of the high-k dielectric layer is slow, the throughput is decreased.

SUMMARY

The invention provides a semiconductor structure, which can improve the capacitance value and reliability of the capacitor structure and can increase the throughput.

The invention provides a semiconductor structure, which includes a substrate and a capacitor structure. The capacitor structure is disposed above the substrate. The capacitor structure includes a first electrode layer, a second electrode layer, and a first dielectric layer. The second electrode layer is disposed on the first electrode layer. The first dielectric layer is disposed between the first electrode layer and the second electrode layer. The first dielectric layer is a composite dielectric layer including at least one first silicon nitride layer and at least one first high-k dielectric layer.

According to an embodiment of the invention, in the semiconductor structure, the material of the first high-k dielectric layer is, for example, aluminum oxide ($Al_2O_3$), zirconium oxide ($ZrO_2$), or tantalum oxide ($Ta_2O_5$).

According to an embodiment of the invention, in the semiconductor structure, the capacitor structure may further include a third electrode layer and a second dielectric layer. The third electrode layer is disposed on the second electrode layer. The second dielectric layer is disposed between the second electrode layer and the third electrode layer.

According to an embodiment of the invention, in the semiconductor structure, the material of the second dielectric layer is, for example, silicon nitride or a high-k dielectric material.

According to an embodiment of the invention, in the semiconductor structure, the second dielectric layer may be a composite dielectric layer including at least one second silicon nitride layer and at least one second high-k dielectric layer.

According to an embodiment of the invention, in the semiconductor structure, the material of the second high-k dielectric layer is, for example, aluminum oxide ($Al_2O_3$), zirconium oxide ($ZrO_2$), or tantalum oxide ($Ta_2O_5$).

According to an embodiment of the invention, in the semiconductor structure, the capacitor structure may further include a third electrode layer and a second dielectric layer. The third electrode layer is disposed between the first electrode layer and the substrate. The second dielectric layer is disposed between the third electrode layer and the first electrode layer.

According to an embodiment of the invention, in the semiconductor structure, the material of the second dielectric layer is, for example, silicon nitride or a high-k dielectric material.

According to an embodiment of the invention, the semiconductor structure may further include a dielectric structure. The dielectric structure is disposed on the substrate. The capacitor structure may be disposed in the dielectric structure.

According to an embodiment of the invention, in the semiconductor structure, the dielectric structure may include a second dielectric layer, a third dielectric layer, and a fourth dielectric layer. The second dielectric layer is disposed on the substrate. The third dielectric layer is disposed on the second dielectric layer. The fourth dielectric layer is disposed on the third dielectric layer. The semiconductor structure may further include a first conductive layer and a second conductive layer. The first conductive layer is disposed in the second dielectric layer. The second conductive layer is disposed in the third dielectric layer and the fourth dielectric layer. The second conductive layer is disposed on the first conductive layer. The second conductive layer is electrically connected to the first conductive layer.

According to an embodiment of the invention, in the semiconductor structure, the second conductive layer may include a via and a conductive line. The via is disposed in the third dielectric layer. The conductive line is disposed in the fourth dielectric layer. The conductive line may be connected to the via.

According to an embodiment of the invention, in the semiconductor structure, the via and the conductive line may be integrally formed.

According to an embodiment of the invention, in the semiconductor structure, the capacitor structure may be disposed in the third dielectric layer.

According to an embodiment of the invention, in the semiconductor structure, the dielectric structure may further include a capping layer and a stop layer. The capping layer is disposed between the second dielectric layer and the third dielectric layer. The stop layer is disposed between the third dielectric layer and the fourth dielectric layer.

According to an embodiment of the invention, in the semiconductor structure, the capping layer may cover a portion of the first conductive layer.

According to an embodiment of the invention, in the semiconductor structure, the capacitor structure may be disposed on the capping layer.

According to an embodiment of the invention, in the semiconductor structure, the capacitor structure may be disposed between the stop layer and the capping layer.

According to an embodiment of the invention, the semiconductor structure may further include a third conductive layer and a fourth conductive layer. The third conductive layer is disposed in the third dielectric layer and the fourth dielectric layer. The third conductive layer is disposed on the first electrode layer. The third conductive layer may be electrically connected to the first electrode layer. The fourth conductive layer is disposed in the third dielectric layer and the fourth dielectric layer. The fourth conductive layer is disposed on the second electrode layer. The fourth conductive layer may be electrically connected to the second electrode layer.

According to an embodiment of the invention, the semiconductor structure may further include a first barrier layer, a second barrier layer, a third barrier layer, and a fourth barrier layer. The first barrier layer is disposed between the first conductive layer and the dielectric structure. The second barrier layer is disposed between the second conductive layer and the dielectric structure and between the second conductive layer and the first conductive layer. The third barrier layer is disposed between the third conductive layer and the dielectric structure and between the third conductive layer and the first electrode layer. The fourth barrier layer is disposed between the fourth conductive layer and the dielectric structure and between the fourth conductive layer and the second electrode layer.

According to an embodiment of the invention, the semiconductor structure may further include a capping layer. The capping layer is disposed in the dielectric structure. The capping layer is disposed on the capacitor structure.

Based on the above description, in the semiconductor structure according to the invention, the first dielectric layer is disposed between the first electrode layer and the second electrode layer, and the first dielectric layer is a composite dielectric layer including at least one first silicon nitride layer and at least one first high-k dielectric layer. Therefore, the capacitance value and reliability of the capacitor structure can be improved, and the throughput can be increased.

In order to make the aforementioned and other objects, features and advantages of the invention comprehensible, several exemplary embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The embodiments are described in detail below with reference to the accompanying drawings, but the embodiments are not intended to limit the scope of the invention. For the sake of easy understanding, the same components in the following description will be denoted by the same reference symbols. In addition, the drawings are for illustrative purposes only and are not drawn to the original dimensions. In fact, the dimensions of the various features may be arbitrarily increased or reduced for clarity of discussion.

Figure 1:
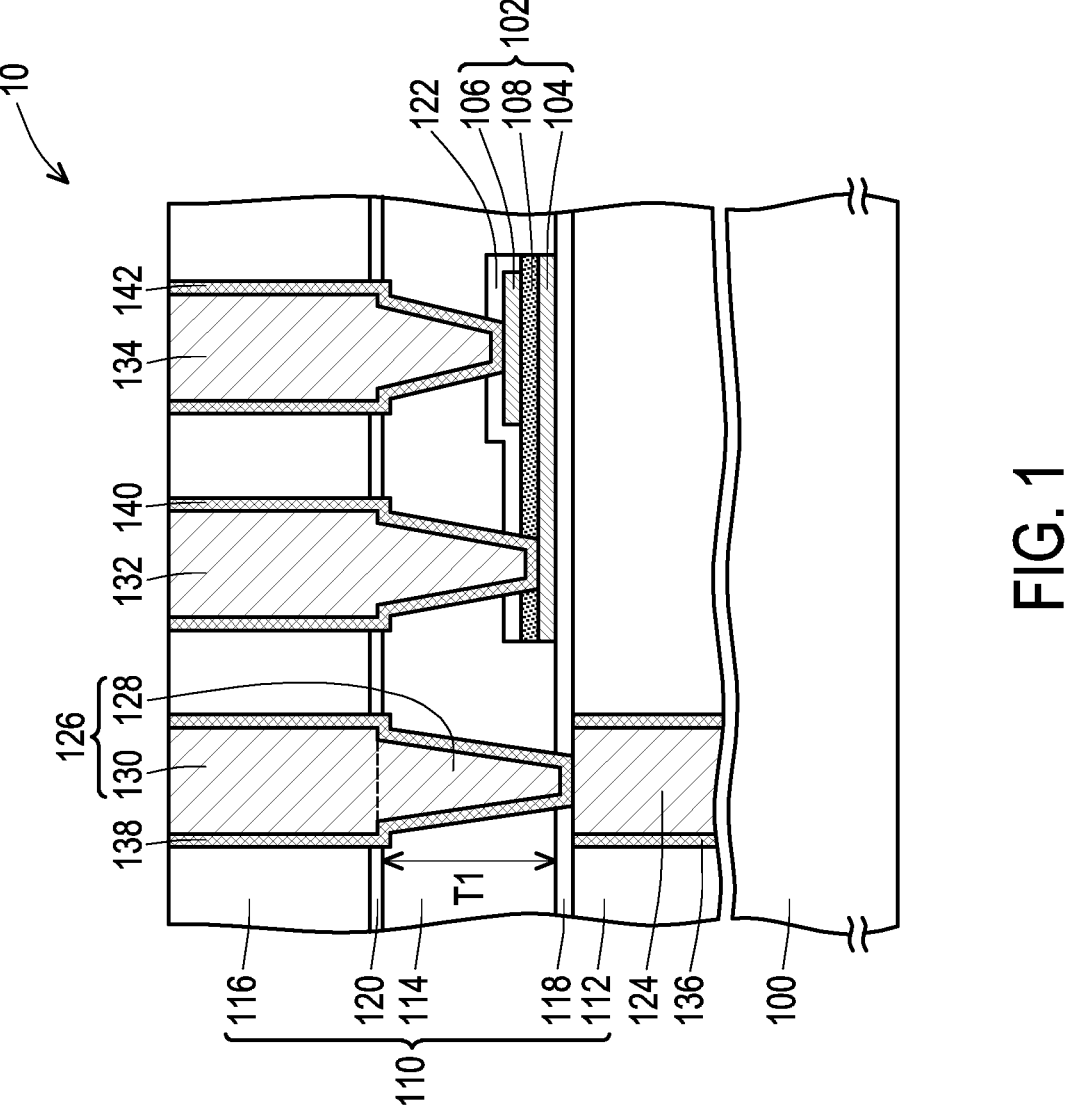
FIG. 1 is a cross-sectional view of a semiconductor structure according to some embodiments of the invention.
Figures 2, 3, 4:
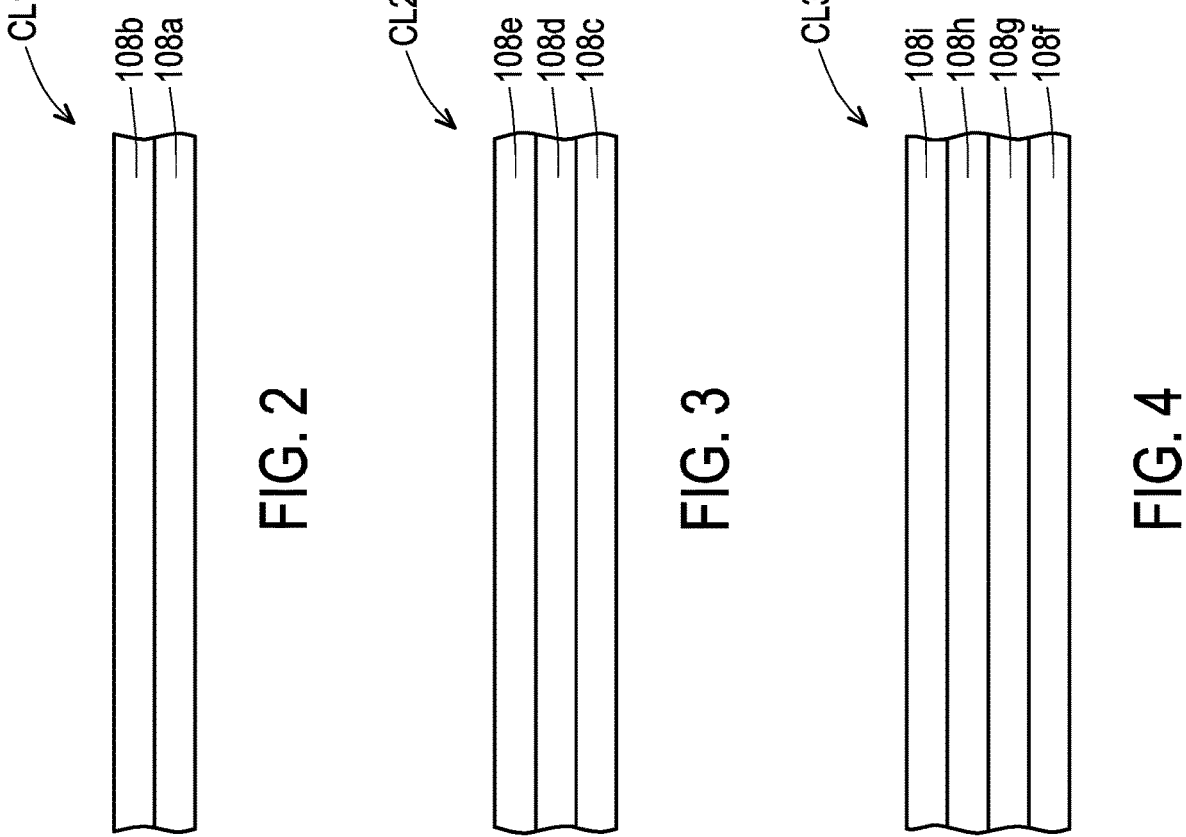
FIG. 2 is a cross-sectional view of a composite dielectric layer according to some embodiments of the invention.
FIG. 3 is a cross-sectional view of a composite dielectric layer according to other embodiments of the invention.
FIG. 4 is a cross-sectional view of a composite dielectric layer according to other embodiments of the invention.

FIG. 1 is a cross-sectional view of a semiconductor structure according to some embodiments of the invention. FIG. 2 is a cross-sectional view of a composite dielectric layer according to some embodiments of the invention. FIG. 3 is a cross-sectional view of a composite dielectric layer according to other embodiments of the invention. FIG. 4 is a cross-sectional view of a composite dielectric layer according to other embodiments of the invention.

Referring to FIG. 1, a semiconductor structure 10 includes a substrate 100 and a capacitor structure 102. In some embodiments, the substrate 100 may be a semiconductor substrate such as a silicon substrate. In addition, although not shown in the figure, the substrate 100 may have required semiconductor devices (e.g., active device), dielectric layers and/or interconnect structures thereon, and the description thereof is omitted here.

The capacitor structure 102 is disposed above the substrate 100. The capacitor structure 102 includes an electrode layer 104, an electrode layer 106, and a dielectric layer 108. In some embodiments, the material of the electrode layer 104 may be a conductive material, such as tantalum (Ta), tantalum nitride (TaN), or a combination thereof. The electrode layer 106 is disposed on the electrode layer 104. In some embodiments, the material of the electrode layer 106 may be a conductive material, such as tantalum, tantalum nitride, or a combination thereof. The dielectric layer 108 is disposed between the electrode layer 104 and the electrode layer 106. The dielectric layer 108 is a composite dielectric layer including at least one silicon nitride layer and at least one high-k dielectric layer. That is, the dielectric layer 108 is a multilayer structure including at least one silicon nitride layer and at least one high-k dielectric layer. In some embodiments, the composite dielectric layer may be any combination of at least one silicon nitride layer and at least one high-k dielectric layer. In the text, "high dielectric constant (high-k)" may be defined as a dielectric constant greater than 7. In some embodiments, the material of the high-k dielectric layer is, for example, aluminum oxide ($Al_2O_3$), zirconium oxide ($ZrO_2$), or tantalum oxide ($Ta_2O_5$).

In some embodiments, the dielectric layer 108 may be a composite dielectric layer CL1 as shown in FIG. 2. The composite dielectric layer CL1 may include a dielectric layer 108a and a dielectric layer 108b. In some embodiments, the dielectric layer 108a and the dielectric layer 108b may be sequentially disposed on the electrode layer 104.

In some embodiments, the dielectric layer 108a may be a silicon nitride layer, and the dielectric layer 108b may be a high-k dielectric layer. That is, the composite dielectric layer CL1 may be a composite dielectric layer of a silicon nitride layer/a high-k dielectric layer. In some embodiments, the dielectric layer 108b may be an aluminum oxide ($Al_2O_3$) layer, a zirconium oxide ($ZrO_2$) layer, or a tantalum oxide ($Ta_2O_5$) layer. For example, the composite dielectric layer CL1 may be a composite dielectric layer of a silicon nitride layer/an aluminum oxide ($Al_2O_3$) layer, but the invention is not limited thereto.

In other embodiments, the dielectric layer 108a may be a high-k dielectric layer, and the dielectric layer 108b may be a silicon nitride layer. That is, the composite dielectric layer CL1 may be a composite dielectric layer of a high-k dielectric layer/a silicon nitride layer. In some embodiments, the dielectric layer 108a may be an aluminum oxide ($Al_2O_3$)

layer, a zirconium oxide ($ZrO_2$) layer, or a tantalum oxide ($Ta_2O_5$) layer. For example, the composite dielectric layer CL1 may be a composite dielectric layer of an aluminum oxide ($Al_2O_3$) layer/a silicon nitride layer, but the invention is not limited thereto.

In some embodiments, the dielectric layer 108 may be a composite dielectric layer CL2 as shown in FIG. 3. The composite dielectric layer CL2 may include a dielectric layer 108*c*, a dielectric layer 108*d*, and a dielectric layer 108*e*. In some embodiments, the dielectric layer 108*c*, the dielectric layer 108*d*, and the dielectric layer 108*e* may be sequentially disposed on the electrode layer 104.

In some embodiments, the dielectric layer 108*c* may be a silicon nitride layer, the dielectric layer 108*d* may be a high-k dielectric layer, and the dielectric layer 108*e* may be a high-k dielectric layer. That is, the composite dielectric layer CL2 may be a composite dielectric layer of a silicon nitride layer/a high-k dielectric layer/a high-k dielectric layer. In some embodiments, the materials of two adjacent high-k dielectric layers (e.g., the dielectric layer 108*d* and the dielectric layer 108*e*) in the composite dielectric layer CL2 may be different high-k dielectric materials. In some embodiments, each of the dielectric layer 108*d* and the dielectric layer 108*e* may be an aluminum oxide ($Al_2O_3$) layer, a zirconium oxide ($ZrO_2$) layer, or a tantalum oxide ($Ta_2O_5$) layer. For example, the composite dielectric layer CL2 may be a composite dielectric layer of a silicon nitride layer/an aluminum oxide ($Al_2O_3$) layer/a zirconium oxide ($ZrO_2$) layer or a composite dielectric layer of a silicon nitride layer/an aluminum oxide ($Al_2O_3$) layer/a tantalum oxide ($Ta_2O_5$), but the invention is not limited thereto.

In other embodiments, the dielectric layer 108*c* may be a high-k dielectric layer, the dielectric layer 108*d* may be a high-k dielectric layer, and the dielectric layer 108*e* may be a silicon nitride layer. That is, the composite dielectric layer CL2 may be a composite dielectric layer of a high-k dielectric layer/a high-k dielectric layer/a silicon nitride layer. In some embodiments, the materials of two adjacent high-k dielectric layers (e.g., the dielectric layer 108*c* and the dielectric layer 108*d*) in the composite dielectric layer CL2 may be different high-k dielectric materials. In some embodiments, each of the dielectric layer 108*c* and the dielectric layer 108*d* may be an aluminum oxide ($Al_2O_3$) layer, a zirconium oxide ($ZrO_2$) layer, or a tantalum oxide ($Ta_2O_5$) layer. For example, the composite dielectric layer CL2 may be a composite dielectric layer of an aluminum oxide ($Al_2O_3$) layer/a zirconium oxide ($ZrO_2$) layer/silicon nitride layer, but the invention is not limited thereto.

In some other embodiments, the composite dielectric layer CL2 may be other combinations of the silicon nitride layer and the high-k dielectric layer (e.g., a composite dielectric layer of a silicon nitride layer/a high-k dielectric layer/a silicon nitride layer), and the description thereof is omitted here.

In some embodiments, the dielectric layer 108 may be a composite dielectric layer CL3 as shown in FIG. 4. The composite dielectric layer CL3 may include a dielectric layer 108*f*, a dielectric layer 108*g*, a dielectric layer 108*h*, and a dielectric layer 108*i*. In some embodiments, the dielectric layer 108*f*, the dielectric layer 108*g*, the dielectric layer 108*h*, and the dielectric layer 108*i* may be sequentially disposed on the electrode layer 104.

In some embodiments, the dielectric layer 108*f* may be a silicon nitride layer, the dielectric layer 108*g* may be a high-k dielectric layer, the dielectric layer 108*h* may be a high-k dielectric layer, and the dielectric layer 108*i* may be a high-k dielectric layer. That is, the composite dielectric layer CL3 may be a composite dielectric layer of a silicon nitride layer/a high-k dielectric layer/a high-k dielectric layer/a high-k dielectric layer. In some embodiments, the materials of two adjacent high-k dielectric layers (e.g., the dielectric layer 108*g* and the dielectric layer 108*h*) in the composite dielectric layer CL3 may be different high-k dielectric materials. In some embodiments, each of the dielectric layer 108*g*, the dielectric layer 108*h*, and the dielectric layer 108*i* may be an aluminum oxide ($Al_2O_3$) layer, a zirconium oxide ($ZrO_2$) layer, or a tantalum oxide ($Ta_2O_5$) layer. For example, the composite dielectric layer CL3 may be a composite dielectric layer of a silicon nitride layer/an aluminum oxide ($Al_2O_3$) layer/a zirconium oxide ($ZrO_2$) layer/an aluminum oxide ($Al_2O_3$) layer, but the invention is not limited thereto.

In other embodiments, the dielectric layer 108*f* may be a high-k dielectric layer, the dielectric layer 108*g* may be a high-k dielectric layer, the dielectric layer 108*h* may be a high-k dielectric layer, and the dielectric layer 108*i* may be a silicon nitride layer. That is, the composite dielectric layer CL3 may be a composite dielectric layer of a high-k dielectric layer/a high-k dielectric layer/a high-k dielectric layer/a silicon nitride layer. In some embodiments, the materials of two adjacent high-k dielectric layers (e.g., the dielectric layer 108*f* and the dielectric layer 108*g*) in the composite dielectric layer CL3 may be different high-k dielectric materials. In some embodiments, each of the dielectric layer 108*f*, the dielectric layer 108*g*, and the dielectric layer 108*h* may be an aluminum oxide ($Al_2O_3$) layer, a zirconium oxide ($ZrO_2$) layer, or a tantalum oxide ($Ta_2O_5$) layer. For example, the composite dielectric layer CL3 may be a composite dielectric layer of an aluminum oxide ($Al_2O_3$) layer/a zirconium oxide ($ZrO_2$) layer/a aluminum oxide ($Al_2O_3$) layer/a silicon nitride layer, but the invention is not limited thereto.

In some other embodiments, the composite dielectric layer CL3 may be other combinations of the silicon nitride layer and the high-k dielectric layer (e.g., a composite dielectric layer of a silicon nitride layer/a high-k dielectric layer/a silicon nitride layer/a high-k dielectric layer), and the description thereof is omitted here.

In addition, the number and combination of the dielectric layers in the composite dielectric layer (e.g., the composite dielectric layer CL1, the composite dielectric layer CL2, or the composite dielectric layer CL3) in the above embodiments are for illustration only, and the invention is not limited thereto. As long as the composite dielectric layer is a multilayer structure including at least one silicon nitride layer and at least one high-k dielectric layer, it falls within the scope of the invention.

In the present embodiment, the capacitor structure 102 includes, for example, two electrode layers (e.g., the electrode layer 104 and the electrode layer 106) and one composite dielectric layer (e.g., the dielectric layer 108), but the invention is not limited thereto. As long as the capacitor structure 102 includes a plurality of electrode layers and at least one composite dielectric layer, it falls within the scope of the invention.

In some embodiments, the semiconductor structure 10 may further include a dielectric structure 110. The dielectric structure 110 is disposed on the substrate 100. In some embodiments, the capacitor structure 102 may be disposed in dielectric structure 110. In some embodiments, the dielectric structure 110 may be a multilayer structure. In some embodiments, the dielectric structure 110 may include a dielectric layer 112, a dielectric layer 114, and a dielectric layer 116. The dielectric layer 112 is disposed on the substrate 100. In some embodiments, the material of the dielectric layer 112 is, for example, silicon oxide. The dielectric layer 114 is disposed on the dielectric layer 112. In some embodiments, the capacitor structure 102 may be disposed in the dielectric layer 114. In some embodiments, the thickness T1 of the dielectric layer 114 is, for example, 200 nm to 500 nm. In some embodiments, the material of the dielectric layer 114 is, for example, silicon oxide. The dielectric layer 116 is disposed on the dielectric layer 114. In some embodiments, the material of the dielectric layer 116 is, for example, silicon oxide.

In some embodiments, the dielectric structure 110 may further include at least one of a capping layer 118 and a stop layer 120. The capping layer 118 is disposed between the dielectric layer 112 and the dielectric layer 114. The capping layer 118 may be used as a diffusion barrier layer. In some embodiments, the capacitor structure 102 may be disposed on the capping layer 118. In some embodiments, the electrode layer 104 may be disposed on the capping layer 118. In some embodiments, the capacitor structure 102 may be disposed between the stop layer 120 and the capping layer 118. In some embodiments, the material of the capping layer 118 is, for example, a dielectric material such as silicon carbonitride (SiCN) or silicon nitride. The stop layer 120 is disposed between the dielectric layer 114 and the dielectric layer 116. In some embodiments, the material of the stop layer 120 is, for example, a dielectric material such as silicon nitride.

In some embodiments, the semiconductor structure 10 may further include a capping layer 122. The capping layer 122 is disposed in the dielectric structure 110. The capping layer 122 is disposed on the capacitor structure 102. In some embodiments, the material of the capping layer 122 is, for example, a dielectric material such as silicon nitride.

In some embodiments, the semiconductor structure 10 may further include a conductive layer 124 and a conductive layer 126. The conductive layer 124 is disposed in the dielectric layer 112. The capping layer 118 may cover a portion of the conductive layer 124. The conductive layer 124 may be used as an interconnect structure. In some embodiments, the conductive layer 124 may include a conductive lines, a via, or a combination thereof. In some embodiments, a portion of the conductive layer 124 shown in FIG. 1 may be a conductive line. In some embodiments, the material of the conductive layer 124 is, for example, copper.

The conductive layer 126 is disposed in the dielectric layer 114 and the dielectric layer 116. The conductive layer 126 is disposed on the conductive layer 124. The conductive layer 126 is electrically connected to the conductive layer 124. The conductive layer 126 may be used as an interconnect structure. The conductive layer 126 may include a via 128 and a conductive line 130. The via 128 is disposed in the dielectric layer 114. The conductive line 130 is disposed in the dielectric layer 116. The conductive line 130 may be connected to the via 128. In some embodiments, the via 128 and the conductive line 130 may be integrally formed. In some embodiments, the material of the conductive layer 126 is, for example, copper.

In some embodiments, the semiconductor structure 10 may further include a conductive layer 132 and a conductive layer 134. The conductive layer 132 is disposed in the dielectric layer 114 and the dielectric layer 116. The conductive layer 132 is disposed on the electrode layer 104. The conductive layer 132 may be electrically connected to the electrode layer 104. The conductive layer 132 may be used as an interconnect structure. In some embodiments, the conductive layer 132 may include a contact, a conductive line, or a combination thereof. In some embodiments, the material of the conductive layer 132 is, for example, copper.

The conductive layer 134 is disposed in the dielectric layer 114 and the dielectric layer 116. The conductive layer 134 is disposed on the electrode layer 106. The conductive layer 134 may be electrically connected to the electrode layer 106. The conductive layer 134 may be used as an interconnect structure. In some embodiments, the conductive layer 134 may include a contact, a conductive line, or a combination thereof. In some embodiments, the material of the conductive layer 134 is, for example, copper.

In some embodiments, the semiconductor structure 10 may further include a barrier layer 136, a barrier layer 138, a barrier layer 140, and a barrier layer 142. The barrier layer 136 is disposed between the conductive layer 124 and the dielectric structure 110. In some embodiments, the material of the barrier layer 136 is, for example, metal (e.g., tantalum), metal nitride (e.g., tantalum nitride), or a combination thereof. In other embodiments, the barrier layer 136 may be omitted.

The barrier layer 138 is disposed between the conductive layer 126 and the dielectric structure 110 and between the conductive layer 126 and the conductive layer 124. In some embodiments, the conductive layer 126 may be electrically connected to the conductive layer 124 by the barrier layer 138, but the invention is not limited thereto. In other embodiments, the barrier layer 138 may be omitted, and the conductive layer 126 may be directly connected to the conductive layer 124. In some embodiments, the material of the barrier layer 138 is, for example, metal (e.g., tantalum), metal nitride (e.g., tantalum nitride), or a combination thereof.

The barrier layer 140 is disposed between the conductive layer 132 and the dielectric structure 110 and between the conductive layer 132 and the electrode layer 104. In some embodiments, the conductive layer 132 may be electrically connected to the electrode layer 104 by the barrier layer 140, but the invention is not limited thereto. In other embodiments, the barrier layer 140 may be omitted, and the conductive layer 132 may be directly connected to the electrode layer 104. In some embodiments, the material of the barrier layer 140 is, for example, metal (e.g., tantalum), metal nitride (e.g., tantalum nitride), or a combination thereof.

The barrier layer 142 is disposed between the conductive layer 134 and the dielectric structure 110 and between the conductive layer 134 and the electrode layer 106. In some embodiments, the conductive layer 134 may be electrically connected to the electrode layer 106 by the barrier layer 142, but the invention is not limited thereto. In other embodiments, the barrier layer 142 may be omitted, and the conductive layer 134 may be directly connected to the electrode layer 106. In some embodiments, the material of the barrier layer 142 is, for example, metal (e.g., tantalum), metal nitride (e.g., tantalum nitride), or a combination thereof.

In addition, the semiconductor structure 10 may further include other interconnect structures for respectively connecting the conductive line layer 126, the conductive layer 132, and the conductive layer 134, and the description thereof is omitted here.

Based on the above embodiments, in the semiconductor structure 10, the dielectric layer 108 is disposed between the electrode layer 104 and the electrode layer 106, and the dielectric layer 108 is a composite dielectric layer including at least one silicon nitride layer and at least one high-k dielectric layer. Therefore, the capacitance value and reliability of the capacitor structure 102 can be improved, and the throughput can be increased.

Figure 5:
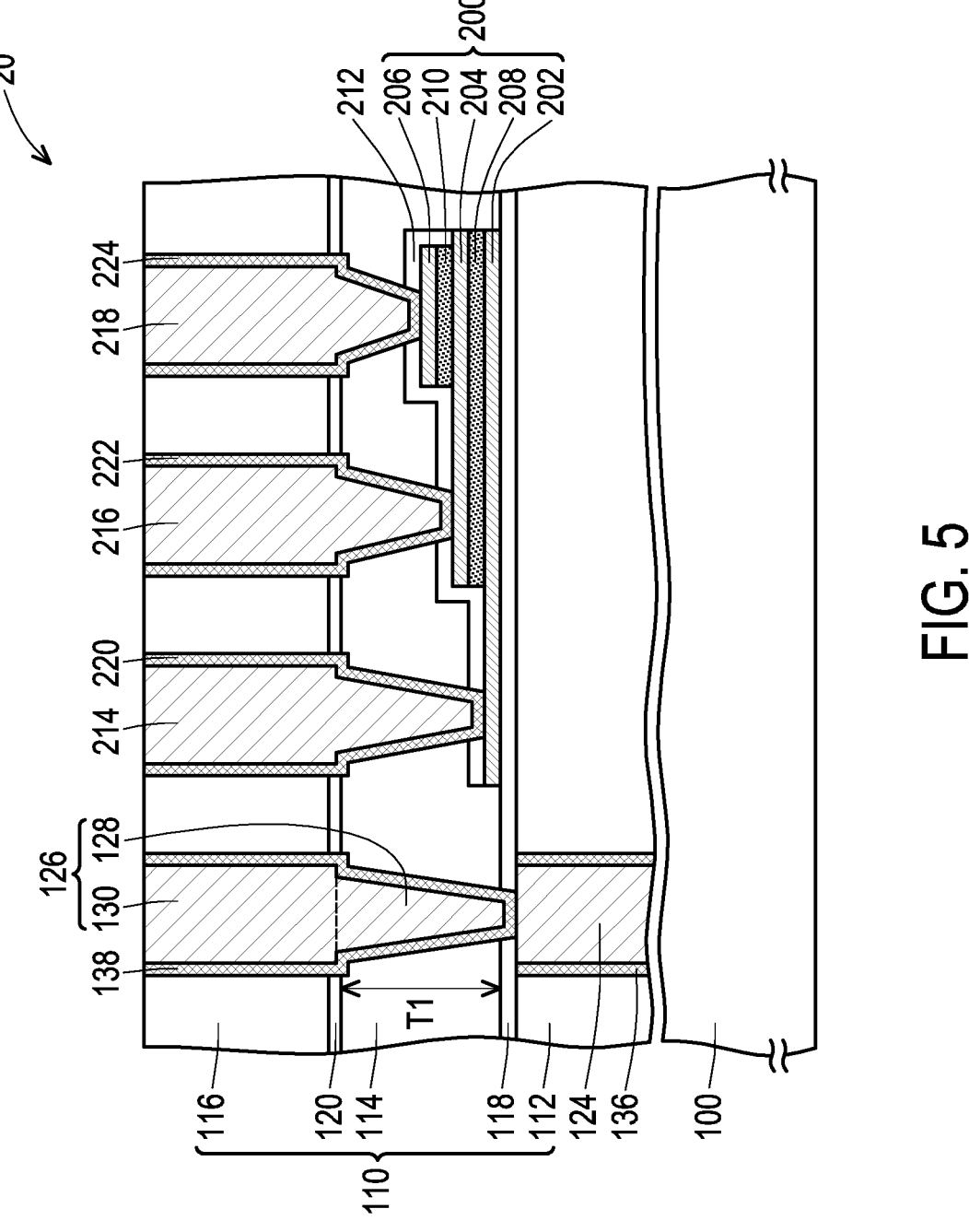
FIG. 5 is a cross-sectional view of a semiconductor structure according to other embodiments of the invention.

FIG. 5 is a cross-sectional view of a semiconductor structure according to other embodiments of the invention.

Referring to FIG. 1 and FIG. 5, the difference between the semiconductor structure 20 in FIG. 5 and the semiconductor structure 10 in FIG. 1 is as follows. The semiconductor structure 20 includes a capacitor structure 200. The capacitor structure 200 is disposed above the substrate 100. In some embodiments, the configuration of the capacitor structure 200 may refer to the configuration of the capacitor structure 102 in the above embodiments, and the description thereof is omitted here. The capacitor structure 200 includes an electrode layer 202, an electrode layer 204, an electrode layer 206, a dielectric layer 208, and a dielectric layer 210. In some embodiments, the electrode layer 202 may be disposed on the capping layer 118. In some embodiments, the material of the electrode layer 202 may be a conductive material, such as tantalum, tantalum nitride, or a combination thereof.

The electrode layer 204 is disposed on the electrode layer 202. The electrode layer 202 is disposed between the electrode layer 204 and the substrate 100. In some embodiments, the material of the electrode layer 204 may be a conductive material, such as tantalum, tantalum nitride, or a combination thereof.

The electrode layer 206 is disposed on the electrode layer 204. The electrode layer 204 is disposed between the electrode layer 206 and the electrode layer 202. In some embodiments, the material of the electrode layer 206 may be a conductive material, such as tantalum, tantalum nitride, or a combination thereof.

The dielectric layer 208 is disposed between the electrode layer 202 and the electrode layer 204. The dielectric layer 210 is disposed between the electrode layer 204 and the electrode layer 206. In some embodiments, the dielectric layer 208 is a composite dielectric layer including at least one silicon nitride layer and at least one high-k dielectric layer, and the material of the dielectric layer 210 is, for example, silicon nitride or a high-k dielectric material (e.g., aluminum oxide ($Al_2O_3$), zirconium oxide ($ZrO_2$), or tantalum oxide ($Ta_2O_5$)). In some embodiments, the material of the high-k dielectric layer is, for example, aluminum oxide ($Al_2O_3$), zirconium oxide ($ZrO_2$), or tantalum oxide ($Ta_2O_5$). In addition, when the dielectric layer 208 is the above-mentioned composite dielectric layer, the details of the dielectric layer 208 may refer to the description of the dielectric layer 108 in FIG. 1 in the above embodiments, and the description thereof is not repeated here. For example, the dielectric layer 208 may be the composite dielectric layer CL1 as shown in FIG. 2, the composite dielectric layer CL2 as shown in FIG. 3, or the composite dielectric layer CL3 as shown in FIG. 4.

In other embodiments, the material of the dielectric layer 208 is, for example, silicon nitride or a high-k dielectric material (e.g., aluminum oxide ($Al_2O_3$), zirconium oxide ($ZrO_2$), or tantalum oxide ($Ta_2O_5$)), and the dielectric layer 210 is a composite dielectric layer including at least one silicon nitride layer and at least one high-k dielectric layer. In some embodiments, the material of the high-k dielectric layer is, for example, aluminum oxide ($Al_2O_3$), zirconium oxide ($ZrO_2$), or tantalum oxide ($Ta_2O_5$). In addition, when the dielectric layer 210 is the above-mentioned composite dielectric layer, the details of the dielectric layer 210 may refer to the description of the dielectric layer 108 in FIG. 1 in the above embodiments, and the description thereof is not repeated here. For example, the dielectric layer 210 may be the composite dielectric layer CL1 as shown in FIG. 2, the composite dielectric layer CL2 as shown in FIG. 3, or the composite dielectric layer CL3 as shown in FIG. 4.

In other embodiments, both the dielectric layer 208 and the dielectric layer 210 may be composite dielectric layers including at least one silicon nitride layer and at least one high-k dielectric layer. In some embodiments, the material of the high-k dielectric layer is, for example, aluminum oxide ($Al_2O_3$), zirconium oxide ($ZrO_2$), or tantalum oxide ($Ta_2O_5$). In addition, when the dielectric layer 208 and the dielectric layer 210 are the above-mentioned composite dielectric layers, the details of the dielectric layer 208 and the dielectric layer 210 may refer to the description of the dielectric layer 108 in FIG. 1 in the above embodiments, and the description thereof is not repeated here. For example, each of the dielectric layer 208 and the dielectric layer 210 may be the composite dielectric layer CL1 as shown in FIG. 2, the composite dielectric layer CL2 as shown in FIG. 3, or the composite dielectric layer CL3 as shown in FIG. 4. In addition, when both the dielectric layer 208 and the dielectric layer 210 are the above-mentioned composite dielectric layers, the number of the dielectric layers in the dielectric layer 208 and the number of the dielectric layers in the dielectric layer 210 may be the same or different. On the other hand, when both the dielectric layer 208 and the dielectric layer 210 are the above-mentioned composite dielectric layers, the combination of the dielectric layers in the dielectric layer 208 and the combination of the dielectric layers in the dielectric layer 210 may be the same or different.

In the semiconductor structure 20, the capacitor structure 200 includes, for example, three electrode layers (e.g., the electrode layer 202, the electrode layer 204, and the electrode layer 206) and two dielectric layers (e.g., the dielectric layer 208 and the dielectric layer 210, wherein at least one of the dielectric layer 208 and the dielectric layer 210 is the above-mentioned composite dielectric layer), but the invention is not limited thereto. As long as the capacitor structure 200 includes a plurality of electrode layers and at least one composite dielectric layer, it falls within the scope of the invention.

In some embodiments, the semiconductor structure 20 may further include a capping layer 212. The capping layer 212 is disposed in dielectric structure 110. The capping layer 212 is disposed on the capacitor structure 200. In some embodiments, the material of the capping layer 212 is, for example, a dielectric material such as silicon nitride.

In some embodiments, the semiconductor structure 20 may further include a conductive layer 214, a conductive layer 216, and a conductive layer 218. The conductive layer 214 is disposed in the dielectric layer 114 and the dielectric layer 116. The conductive layer 214 is disposed on the electrode layer 202. The conductive layer 214 may be electrically connected to the electrode layer 202. The conductive layer 214 may be used as an interconnect structure. In some embodiments, the conductive layer 214 may include a contact, a conductive line, or a combination thereof. In some embodiments, the material of the conductive layer 214 is, for example, copper.

The conductive layer 216 is disposed in the dielectric layer 114 and the dielectric layer 116. The conductive layer 216 is disposed on the electrode layer 204. The conductive layer 216 may be electrically connected to the electrode layer 204. The conductive layer 216 may be used as an interconnect structure. In some embodiments, the conductive layer 216 may include a contact, a conductive line, or a combination thereof. In some embodiments, the material of the conductive layer 216 is, for example, copper.

The conductive layer 218 is disposed in the dielectric layer 114 and the dielectric layer 116. The conductive layer 218 is disposed on the electrode layer 206. The conductive layer 218 may be electrically connected to the electrode layer 206. The conductive layer 218 may be used as an interconnect structure. In some embodiments, the conductive layer 218 may include a contact, a conductive line, or a combination thereof. In some embodiments, the material of the conductive layer 218 is, for example, copper.

In some embodiments, the semiconductor structure 20 may further include a barrier layer 220, a barrier layer 222, and a barrier layer 224. The barrier layer 220 is disposed between the conductive layer 214 and the dielectric structure 110 and between the conductive layer 214 and the electrode layer 202. In some embodiments, the conductive layer 214 may be electrically connected to the electrode layer 202 by the barrier layer 220, but the invention is not limited thereto. In other embodiments, the barrier layer 220 may be omitted, and the conductive layer 214 may be directly connected to the electrode layer 202. In some embodiments, the material of the barrier layer 220 is, for example, metal (e.g., tantalum), metal nitride (e.g., tantalum nitride), or a combination thereof.

The barrier layer 222 is disposed between the conductive layer 216 and the dielectric structure 110 and between the conductive layer 216 and the electrode layer 204. In some embodiments, the conductive layer 216 may be electrically connected to the electrode layer 204 by the barrier layer 222, but the invention is not limited thereto. In other embodiments, the barrier layer 222 may be omitted, and the conductive layer 216 may be directly connected to the electrode layer 204. In some embodiments, the material of the barrier layer 222 is, for example, metal (e.g., tantalum), metal nitride (e.g., tantalum nitride), or a combination thereof.

The barrier layer 224 is disposed between the conductive layer 218 and the dielectric structure 110 and between the conductive layer 218 and the electrode layer 206. In some embodiments, the conductive layer 218 may be electrically connected to the electrode layer 206 by the barrier layer 224, but the invention is not limited thereto. In other embodiments, the barrier layer 224 may be omitted, and the conductive layer 218 may be directly connected to the electrode layer 206. In some embodiments, the material of the barrier layer 224 is, for example, metal (e.g., tantalum), metal nitride (e.g., tantalum nitride), or a combination thereof.

In addition, the semiconductor structure 20 may further include other interconnect structures for respectively connecting the conductive line layer 126, the conductive layer 214, the conductive layer 216, and the conductive layer 218, and the description thereof is omitted here. For example, the electrode layer 202 and the electrode layer 206 may be electrically connected to each other by the barrier layer 220, the conductive layer 214, the barrier layer 224, the conductive layer 218, and other interconnect structures (not shown).

In addition, in the semiconductor structure 10 of FIG. 1 and the semiconductor structure 20 of FIG. 2, the same or similar components are denoted by the same reference symbols, and the description thereof is omitted.

Based on the above embodiments, in the semiconductor structure 20, at least one of the dielectric layer 208 and the dielectric layer 210 is a composite dielectric layer including at least one silicon nitride layer and at least one high-k dielectric layer. Therefore, the capacitance value and reliability of the capacitor structure 200 can be improved, and the throughput can be increased.

In summary, in the semiconductor structure of the aforementioned embodiments, a capacitor structure includes a first electrode layer, a second electrode layer, and a first dielectric layer. The first dielectric layer is disposed between the first electrode layer and the second electrode layer. The first dielectric layer is a composite dielectric layer including at least one first silicon nitride layer and at least one first high-k dielectric layer. Therefore, the capacitance value and reliability of the capacitor structure can be improved, and the throughput can be increased.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A semiconductor structure, comprising:
   a substrate; and
   a capacitor structure disposed above the substrate and comprising:
      a first electrode layer;
      a second electrode layer disposed on the first electrode layer; and
      a first dielectric layer disposed between the first electrode layer and the second electrode layer, wherein the first dielectric layer is a composite dielectric layer comprising at least one first silicon nitride layer and at least one first high dielectric constant (high-k) dielectric layer.

2. The semiconductor structure according to claim 1, wherein a material of the first high-k dielectric layer comprises aluminum oxide, zirconium oxide, or tantalum oxide.

3. The semiconductor structure according to claim 1, wherein the capacitor structure further comprises:
   a third electrode layer disposed on the second electrode layer; and
   a second dielectric layer disposed between the second electrode layer and the third electrode layer.

4. The semiconductor structure according to claim 3, wherein a material of the second dielectric layer is silicon nitride or a high-k dielectric material.

5. The semiconductor structure according to claim 3, wherein the second dielectric layer is a composite dielectric layer comprising at least one second silicon nitride layer and at least one second high-k dielectric layer.

6. The semiconductor structure according to claim 5, wherein a material of the second high-k dielectric layer comprises aluminum oxide, zirconium oxide, or tantalum oxide.

7. The semiconductor structure according to claim 1, wherein the capacitor structure further comprises:
   a third electrode layer disposed between the first electrode layer and the substrate; and
   a second dielectric layer disposed between the third electrode layer and the first electrode layer.

8. The semiconductor structure according to claim 7, wherein a material of the second dielectric layer is silicon nitride or a high-k dielectric material.

9. The semiconductor structure according to claim 1, further comprising:
   a dielectric structure disposed on the substrate, wherein the capacitor structure is disposed in the dielectric structure.

10. The semiconductor structure according to claim 9, wherein the dielectric structure comprises:

a second dielectric layer disposed on the substrate;

a third dielectric layer disposed on the second dielectric layer; and a fourth dielectric layer disposed on the third dielectric layer, and the semiconductor structure further comprises:

a first conductive layer disposed in the second dielectric layer; and a second conductive layer disposed in the third dielectric layer and the fourth dielectric layer and disposed on the first conductive layer, wherein the second conductive layer is electrically connected to the first conductive layer.

11. The semiconductor structure according to claim 10, wherein the second conductive layer comprises:

a via disposed in the third dielectric layer; and a conductive line disposed in the fourth dielectric layer and connected to the via.

12. The semiconductor structure according to claim 11, wherein the via and the conductive line are integrally formed.

13. The semiconductor structure according to claim 10, wherein the capacitor structure is disposed in the third dielectric layer.

14. The semiconductor structure according to claim 10, wherein the dielectric structure further comprises:

a capping layer disposed between the second dielectric layer and the third dielectric layer; and a stop layer disposed between the third dielectric layer and the fourth dielectric layer.

15. The semiconductor structure according to claim 14, wherein the capping layer covers a portion of the first conductive layer.

16. The semiconductor structure according to claim 14, wherein the capacitor structure is disposed on the capping layer.

17. The semiconductor structure according to claim 14, wherein the capacitor structure is disposed between the stop layer and the capping layer.

18. The semiconductor structure according to claim 10, further comprising:

a third conductive layer disposed in the third dielectric layer and the fourth dielectric layer and disposed on the first electrode layer, wherein the third conductive layer is electrically connected to the first electrode layer; and a fourth conductive layer disposed in the third dielectric layer and the fourth dielectric layer and disposed on the second electrode layer, wherein the fourth conductive layer is electrically connected to the second electrode layer.

19. The semiconductor structure according to claim 18, further comprising:

a first barrier layer disposed between the first conductive layer and the dielectric structure;

a second barrier layer disposed between the second conductive layer and the dielectric structure and between the second conductive layer and the first conductive layer;

a third barrier layer disposed between the third conductive layer and the dielectric structure and between the third conductive layer and the first electrode layer, and a fourth barrier layer disposed between the fourth conductive layer and the dielectric structure and between the fourth conductive layer and the second electrode layer.

20. The semiconductor structure according to claim 9, further comprising:

a capping layer disposed in the dielectric structure and disposed on the capacitor structure.

* * * * *